United States Patent
Rahim et al.

(10) Patent No.: US 9,425,192 B2
(45) Date of Patent: Aug. 23, 2016

(54) INTEGRATED CIRCUIT DECOUPLING CAPACITORS

(75) Inventors: Irfan Rahim, Milpitas, CA (US); William Bradley Vest, San Jose, CA (US); Myron Wai Wong, Fremont, CA (US)

(73) Assignee: Altera Corporation, San Jose, CA (US)

( * ) Notice: Subject to any disclaimer, the term of this patent is extended or adjusted under 35 U.S.C. 154(b) by 391 days.

(21) Appl. No.: 12/332,928

(22) Filed: Dec. 11, 2008

(65) Prior Publication Data

US 2010/0148304 A1     Jun. 17, 2010

(51) Int. Cl.
*H01L 29/00*     (2006.01)
*H01L 27/08*     (2006.01)
*H01L 23/522*    (2006.01)
*H01L 23/528*    (2006.01)

(52) U.S. Cl.
CPC ....... *H01L 27/0805* (2013.01); *H01L 23/5223* (2013.01); *H01L 23/5286* (2013.01); *H01L 2924/0002* (2013.01)

(58) Field of Classification Search
CPC ........... H01L 23/5223; H01L 27/0805; H01L 23/5286; H01L 2924/0002; H01L 2924/00
USPC .................................. 257/68, 296
See application file for complete search history.

(56) References Cited

U.S. PATENT DOCUMENTS

| | | | |
|---|---|---|---|
| 5,844,853 A * | 12/1998 | Kitsukawa et al. .......... 365/226 |
| 6,015,729 A * | 1/2000 | Shirley et al. ................. 438/239 |
| 6,385,033 B1 * | 5/2002 | Javanifard et al. ........ 361/306.2 |
| 6,426,250 B1 | 7/2002 | Lee |
| 6,963,483 B2 * | 11/2005 | Chakravorty et al. ..... 361/306.3 |
| 6,970,032 B1 * | 11/2005 | Smith et al. .................. 327/407 |
| 7,098,523 B2 * | 8/2006 | Chen et al. .................... 257/533 |
| 7,473,979 B2 * | 1/2009 | Clevenger et al. ........... 257/532 |
| 7,692,467 B2 * | 4/2010 | Beker .......................... 327/311 |
| 7,701,277 B2 * | 4/2010 | Toffolon et al. ............... 327/310 |
| 8,667,367 B2 * | 3/2014 | Khellah et al. ............... 714/763 |
| 2004/0056295 A1 * | 3/2004 | Agarwal et al. .............. 257/296 |
| 2004/0217478 A1 * | 11/2004 | Yamamoto et al. .......... 257/758 |
| 2007/0132061 A1 | 6/2007 | Chen |
| 2007/0230087 A1 * | 10/2007 | Komaki ..................... 361/306.2 |
| 2008/0122032 A1 * | 5/2008 | Tu et al. ....................... 257/532 |
| 2008/0186649 A1 | 8/2008 | Beker |
| 2009/0146743 A1 * | 6/2009 | Kaneko et al. ................. 331/16 |
| 2009/0153239 A1 * | 6/2009 | Toffolon et al. .............. 327/551 |

FOREIGN PATENT DOCUMENTS

CN     1848436     10/2006
CN     101675521     3/2010

* cited by examiner

*Primary Examiner* — Ermias Woldegeorgis
*Assistant Examiner* — Benjamin Tzu-Hung Liu

(57) ABSTRACT

Power supply decoupling capacitors are provided for integrated circuits. The decoupling capacitors may be distributed in clusters amongst powered circuit components. Each cluster may contain a number of individual capacitor cells that are connected in parallel. Each capacitor cell may contain a capacitor and a resistor connected in series with the capacitor. The capacitors may be metal-insulator-metal (MIM) capacitors. The resistor in each cell may limit the current through an individual capacitor in the event of a short in the capacitor due to a dielectric defect.

13 Claims, 14 Drawing Sheets

INTEGRATED CIRCUIT DECOUPLING CAPACITORS

BACKGROUND

This invention relates to integrated circuit decoupling capacitors, such as decoupling capacitors for minimizing power supply noise.

Decoupling capacitors may be used to help power sources provide more stable power to powered circuit components. Decoupling capacitors allow high frequency noise on direct current (DC) power lines to be shunted directly between the lines, preventing the noise from reaching powered circuit components. If a power supply is required to switch between various modes of operation, an adequate decoupling capacitance can act as an energy reserve, lessening the magnitude of undesired dips in voltage during mode switching events.

Advances in integrated circuit design sometimes require power supplies to supply stable power for integrated circuits operating at high data rates and clock speeds. This requires increasing amounts of decoupling capacitance per integrated circuit area. A large decoupling capacitance could occupy a disproportionate amount of valuable surface area on an integrated circuit. An efficient and effective way is needed to implement large decoupling capacitances on an integrated circuit in order to maximize their effectiveness and minimize their footprint on the integrated circuit.

Decoupling capacitors for reducing power supply noise are sometimes placed adjacent to an integrated circuit on a printed circuit board. However, use of external decoupling capacitors arrangements such as these can introduce undesired interposed inductances and resistances, reducing the effectiveness of the decoupling capacitors in reducing power supply noise.

Conventional on-chip decoupling capacitors have been implemented using large, localized unitary gate oxide capacitor structures. While this type of arrangement may help to reduce power supply noise, large capacitor structures such as these are vulnerable to faults. If a fault shorts a large gate oxide capacitor, an unacceptably large current could flow across the shorted capacitor rendering the integrated circuit unusable. Such a fault could arise during production or in the field as a result of a latent dielectric defect. As larger and larger decoupling capacitances are implemented on integrated circuits to accommodate increasing data rates and power supply mode switching, the chances of experiencing this type of fault tends to increase. Moreover, decoupling capacitors that are localized in a particular portion of an integrated circuit tend not to be as effective as might be possible using other schemes.

It would therefore be desirable to provide improved integrated circuit decoupling capacitors.

SUMMARY

In accordance with the present invention, decoupling capacitors are provided for power supplies on integrated circuits. The decoupling capacitors may be distributed on the integrated circuits in clusters of capacitor cells. The capacitor cells in each cluster may be connected in parallel. Each capacitor cell may contain a capacitor and a resistor connected in series with the capacitor. In the event of a fault that shorts a capacitor in a capacitor cell, the series resistance may limit the current flowing though the capacitor cell to an acceptable value and also since the cell capacitance is small the fault will reduce the overall decoupling capacitor by a small amount.

The decoupling capacitors may be formed from any suitable type of capacitor structure. The decoupling capacitors may, for example, be metal-insulator-metal (MIM) capacitors of a suitable geometry. The decoupling capacitors may also be implemented using metal-oxide-semiconductor (MOS) capacitors. The decoupling capacitors may be located between a semiconductor substrate and a first metal layer in an integrated circuit dielectric stack.

The series resistance may be implemented as a resistive path through a source-drain implant region on the semiconductor substrate.

The decoupling capacitors may be used on any suitable integrated circuit, such as a programmable integrated circuit. Use of the decoupling capacitor may help to reduce power supply noise, particularly in environments in which power supplies switch between different modes of operation. For example, the decoupling capacitors can be used to reduce power supply noise on integrated circuits in which a power supply generates power supply voltages of varying magnitudes in different operating modes.

Further features of the invention, its nature, and various advantages will be more apparent from the accompanying drawings and the following detailed description.

DETAILED DESCRIPTION

The present invention relates to capacitors such as decoupling capacitors for power supplies on an integrated circuit. The decoupling capacitors can be implemented using a distributed scheme. This allows the capacitors to be located adjacent to circuit components, thereby increasing their effectiveness at reducing noise. Ballast devices such as resistors may be used to protect the integrated circuit from excessive currents in the event of a fault in a capacitor. Efficient capacitor structures can be used to conserve integrated circuit real estate.

Figure 1:
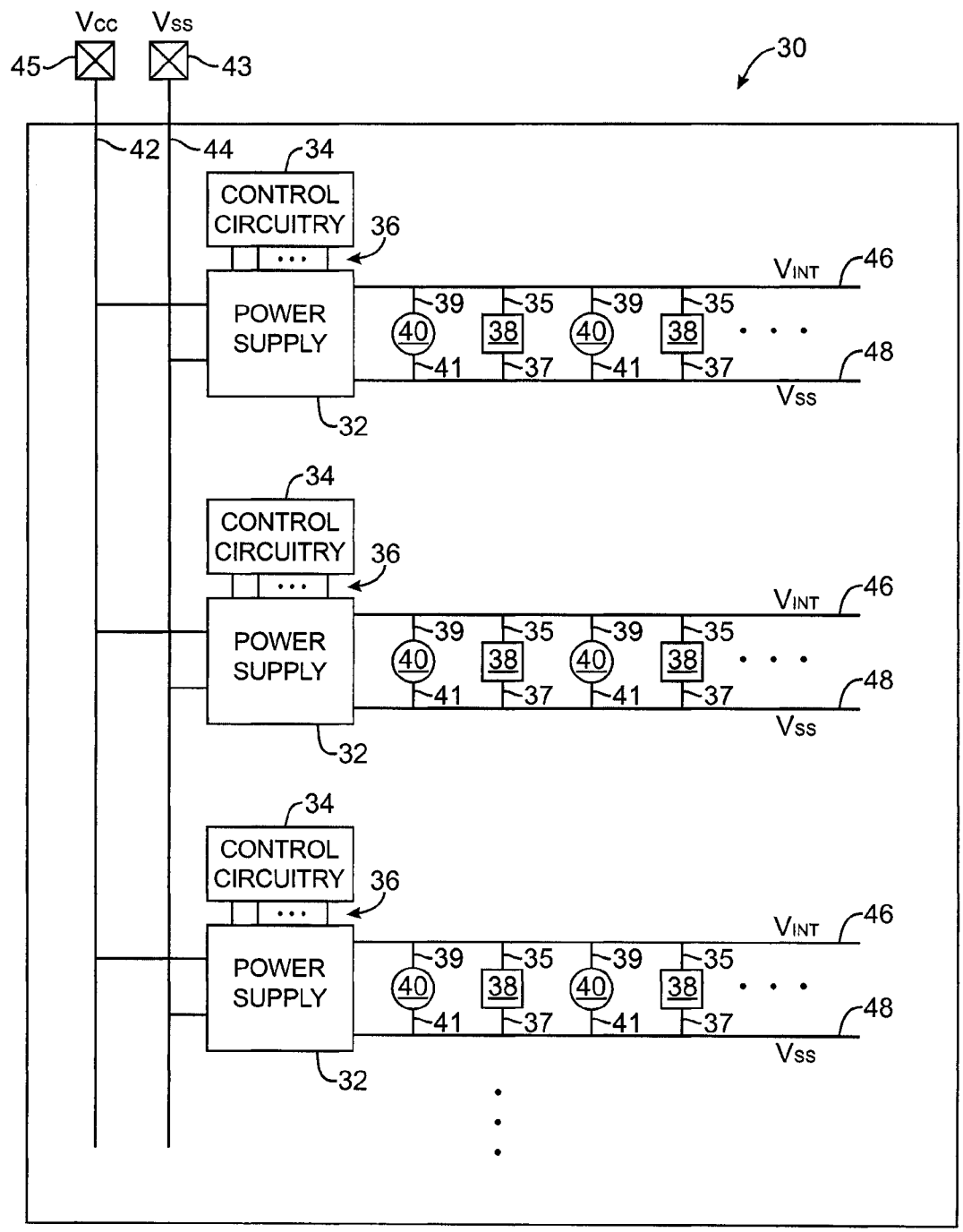
FIG. 1 is a diagram of an illustrative integrated circuit with distributed decoupling capacitors in accordance with an embodiment of the present invention.

A circuit diagram of an illustrative integrated circuit with distributed decoupling capacitors in accordance with the present invention is shown in FIG. 1. Integrated circuit 30 may contain one or more power supplies 32. The power supplies may be constructed using any suitable architecture. For example, each power supply may supply an identical fixed output power supply voltage or each power supply may produce a different output power supply voltage. Power supplies 32 may also produce time-varying outputs.

Power supplies 32 may receive a positive power supply voltage Vcc (e.g. 1.1 volts) from power line 42 and a ground power supply voltage Vss (e.g. 0 volts) from power line 44. Lines such as line 42 may be connected to one or more positive power supply pins such as positive power supply pin 45. Lines such as ground line 44 may be connected to one or more ground power supply pins such as pin 43. Pins 45 and 43 may be connected to sources of power for circuit 30. The sources for positive power supply voltage Vcc and ground power supply voltage Vss may be located off of the integrated circuit chip (e.g. on the same printed circuit board on which circuit 30 is mounted). Power supplies 32 output regulated voltages such as positive output voltage $V_{INT}$ and ground voltage Vss.

Optional control circuitry 34 may be connected to power supply 32 by one or more control paths 36. Control circuitry may be used to configure the power supplies' behavior. For example, control circuitry 34 may be used to set the magnitude of positive power supply voltage $V_{INT}$.

Power supplies 32 provide power to powered circuit components 38 on the integrated circuit. The positive output voltage $V_{INT}$ may be conveyed along paths such as power lines 46 and the ground voltage Vss may be conveyed along paths such as power line 48. Powered circuit components 38 may each have a first associated conductive path 35 that is connected to power line 46 and a second associated conductive path 37 that is connected to power line 48. Powered circuit components 38 may be located in different regions on the integrated circuit. Each powered circuit component 38 may include one or more individual devices such as transistors.

On a device such as a programmable logic device integrated circuit, each component 38 may represent a block of programmable logic, a memory block, or other circuitry. There may be, for example, tens, hundreds, thousands, or more than thousands of components 38 on a given integrated circuit 30. A corresponding number of power supplies and power distribution paths such as paths 46 and 48 may be used in powering these components. The arrangement of FIG. 1 in which a relatively small number of components 38 and associated power supply 32 are shown is merely illustrative.

Capacitor components 40 may be connected in parallel with powered circuit components 38. Capacitor components 40 may each have a first associated conductive path 39 that is connected to power line 46 and a second associated conductive path 41 that is connected to power line 48. The capacitor components may be distributed throughout different regions on the integrated circuit so that they are close to powered circuit components. This helps to reduce interposed inductances and resistances and thereby enhances the effectiveness of capacitor components 40 in serving as noise-reducing decoupling capacitors.

Capacitor components 40 and powered circuit components 48 are shown in alternating order in FIG. 1 in order to emphasize how the capacitor components may be distributed amongst the powered circuit components on integrated circuit 30. A capacitor component 40 may be considered to be close to or adjacent to a circuit component 38 when these respective components are located within a given distance (e.g. within 5 mm, within 1 mm, within 0.5 mm, within 0.1 mm, etc.)

Figure 2:
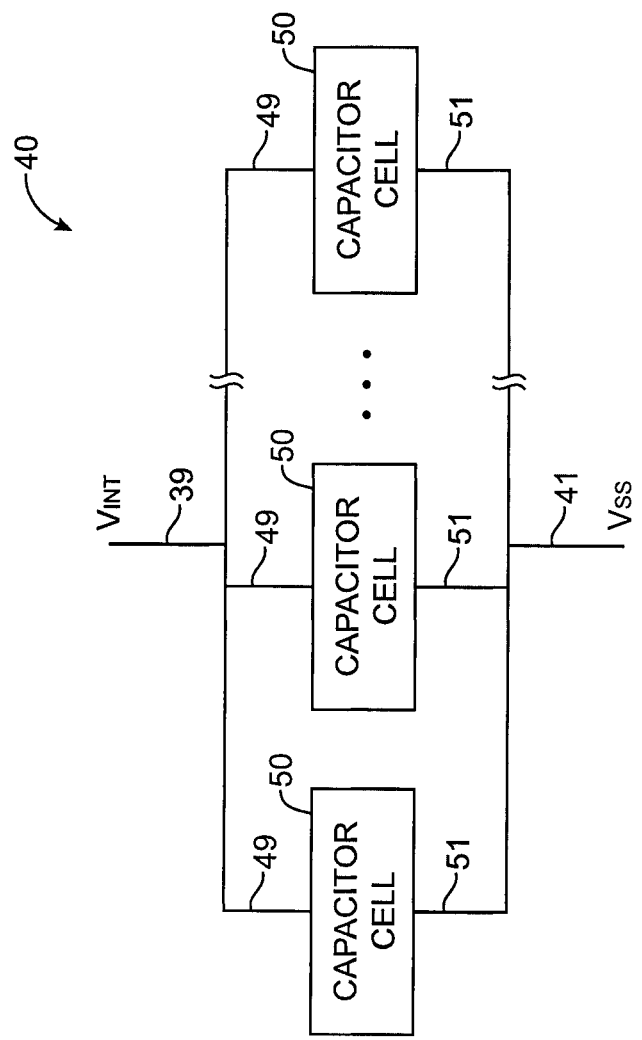
FIG. 2 is a circuit diagram showing a cluster of capacitor cells in which the capacitor cells are connected in parallel in accordance with an embodiment of the present invention.

Each capacitor component 40 may consist of a cluster of one or more capacitor cells 50 that are connected in parallel, as shown in FIG. 2. Capacitor cells 50 may each have a first terminal 49 that is connected to conductive capacitor terminal path 39 and a second terminal 51 that is connected to conductive capacitor terminal path 41. Capacitor components 40 and each of its cells 50 may receive positive power supply voltage $V_{INT}$ from terminal 39 and ground power supply voltage Vss from terminal 41.

Figures 3A, 3B, 3C:
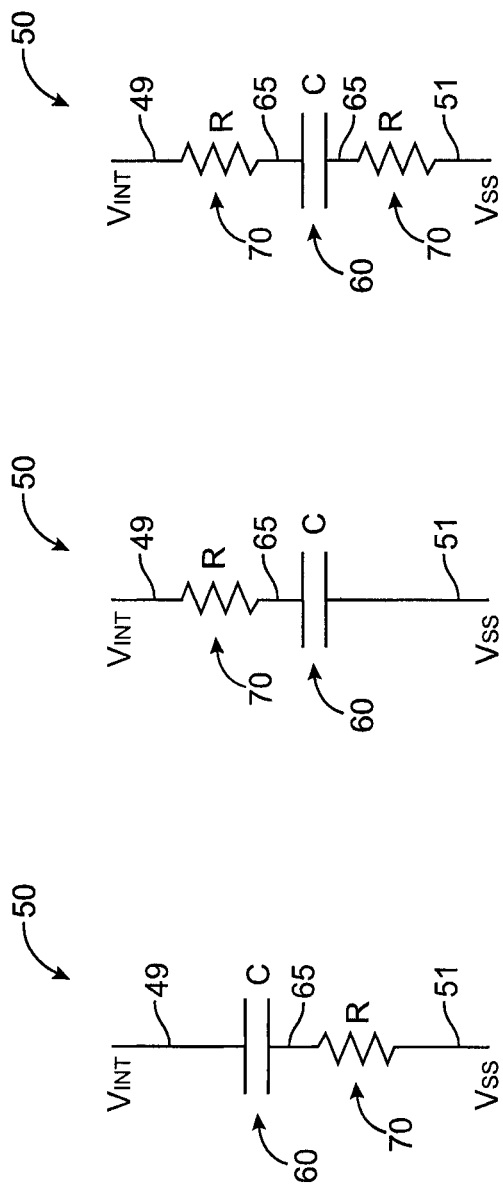
FIG. 3A is a circuit diagram showing a capacitor cell containing a capacitor and a resistor that is connected in series downstream from the capacitor in accordance with an embodiment of the present invention.
FIG. 3B is a circuit diagram showing a capacitor cell containing a capacitor and a resistor that is connected in series upstream from the capacitor upstream in accordance with an embodiment of the present invention.
FIG. 3C is a circuit diagram showing a capacitor cell containing a capacitor and two resistors connected in series on either side of the capacitor in accordance with an embodiment of the present invention.

Each capacitor cell 50 may have a capacitor 60 connected in series with one or more optional resistors 70 as shown in FIGS. 3A, 3B, and 3C. Resistors 70 may serve as ballast devices for capacitor cells 50 that limit the amount of current that can flow through the cells in the event of short circuit due to a fault (e.g. a dielectric defect). Each capacitor 60 may be connected by a conductive line 65 to one or more resistors 70. Each capacitor 60 may have a capacitance C and each resistor 70 may have a resistance R. The capacitors 60 and resistors 70 that are located within each cluster 40 may have identical or different values of capacitances C and resistances R. The resistor of each cell may be located downstream from capacitor 60 (closer to Vss) as shown in FIG. 3A, or upstream from capacitor 60 (closer to Vcc) as shown in FIG. 3B. There may be two resistors 70 located on either side of capacitor 60 as shown in FIG. 3C. In the arrangement of the type shown in FIG. 3C, the values of each resistance may be the same or may be different. Capacitor cells 50 may be connected between positive power supply voltage $V_{INT}$ terminal 49 and ground power supply voltage terminal 51 to reduce power supply noise.

Figure 4:
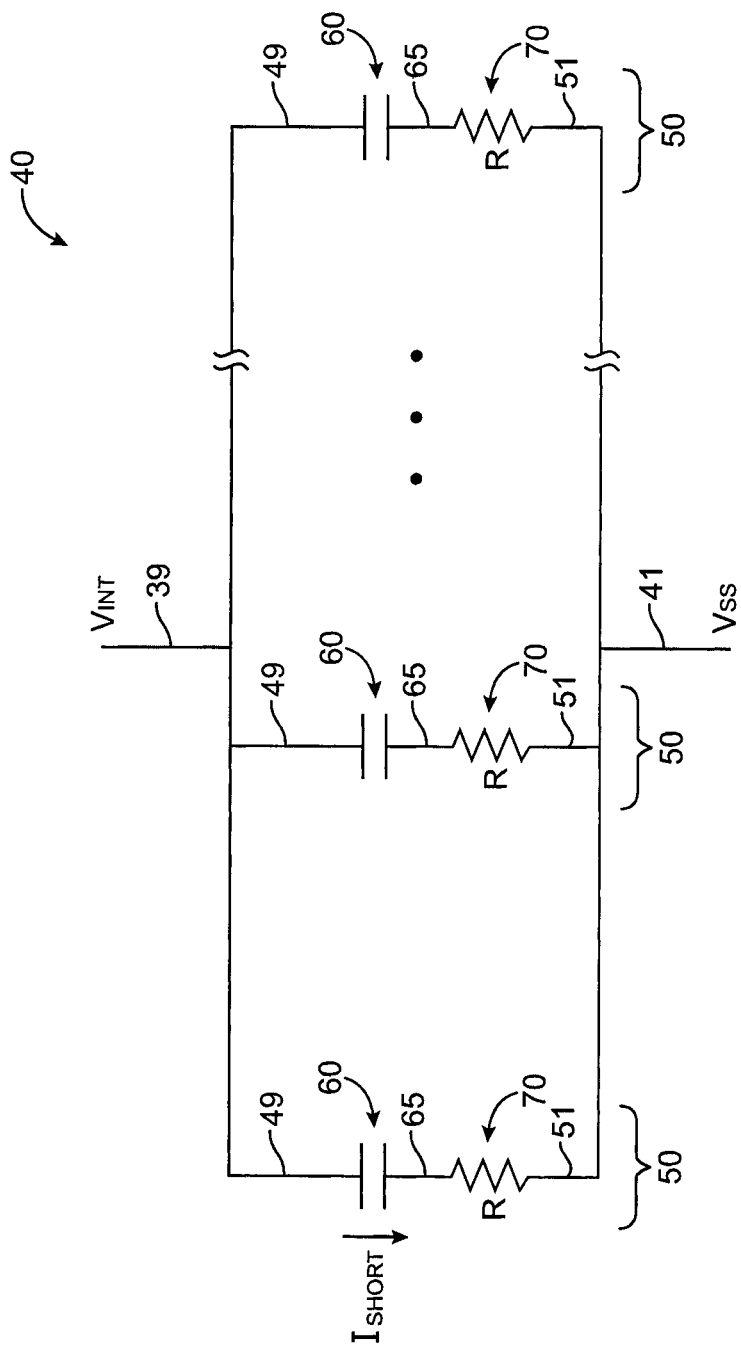
FIG. 4 is a circuit diagram showing a cluster of capacitor cells with each capacitor cell containing a capacitor and a series resistor in accordance with an embodiment of the present invention.

In the example of FIG. 4, capacitor component 40 is formed from a cluster of capacitor cells 50 each having a resistor 70 downstream from a capacitor 60. Capacitor cells in the same cluster generally have capacitors and resistors positioned in the same order (i.e. with all resistors either downstream or upstream from the capacitors), but this is not required. Each capacitor 60 may have a terminal 49 connected to a positive power supply terminal such as a terminal connected to $V_{INT}$ conductive path 39. Resistors 70 may each be connected to a respective capacitor 60 by a respective conductive line 65 and may each be connected through a respective terminal 51 to a ground power supply terminal such as a terminal connected to conductive line 41.

Each resistor 70 limits the current flowing through its associated capacitor cell 50 in the event of a fault in its associated capacitor 60. Faults may arise as a result of dielectric defects. A fault might arise during production of integrated circuit 30 or might arise in the field due to a latent dielectric defect. A fault such as a dielectric defect could cause the terminals of capacitor 60 to become shorted together. When a fault shorts the terminals of capacitor 60 together, the resistance of capacitor 60 becomes essentially zero. In this situation, resistor 70 limits the resulting current $I_{SHORT}$ through capacitor cell 50 to $(V_{INT}-Vss)/R$. The values of resistances R may be selected to avoid damaging integrated circuit 30 in the event to fault.

Distributed decoupling capacitors such as capacitor components 40 may be used in any suitable types of integrated circuits such as microprocessors, digital signal processors, or application specific integrated circuits. The integrated circuits may also be programmable integrated circuits. Examples of programmable integrated circuits include programmable logic devices (also sometimes referred to as field-programmable gate arrays) and integrated circuits that have programmable circuitry, but which are not typically referred to as programmable logic devices, such as microprocessors, digital signal processors, or application specific integrated circuits that contain programmable circuitry.

Figure 5:
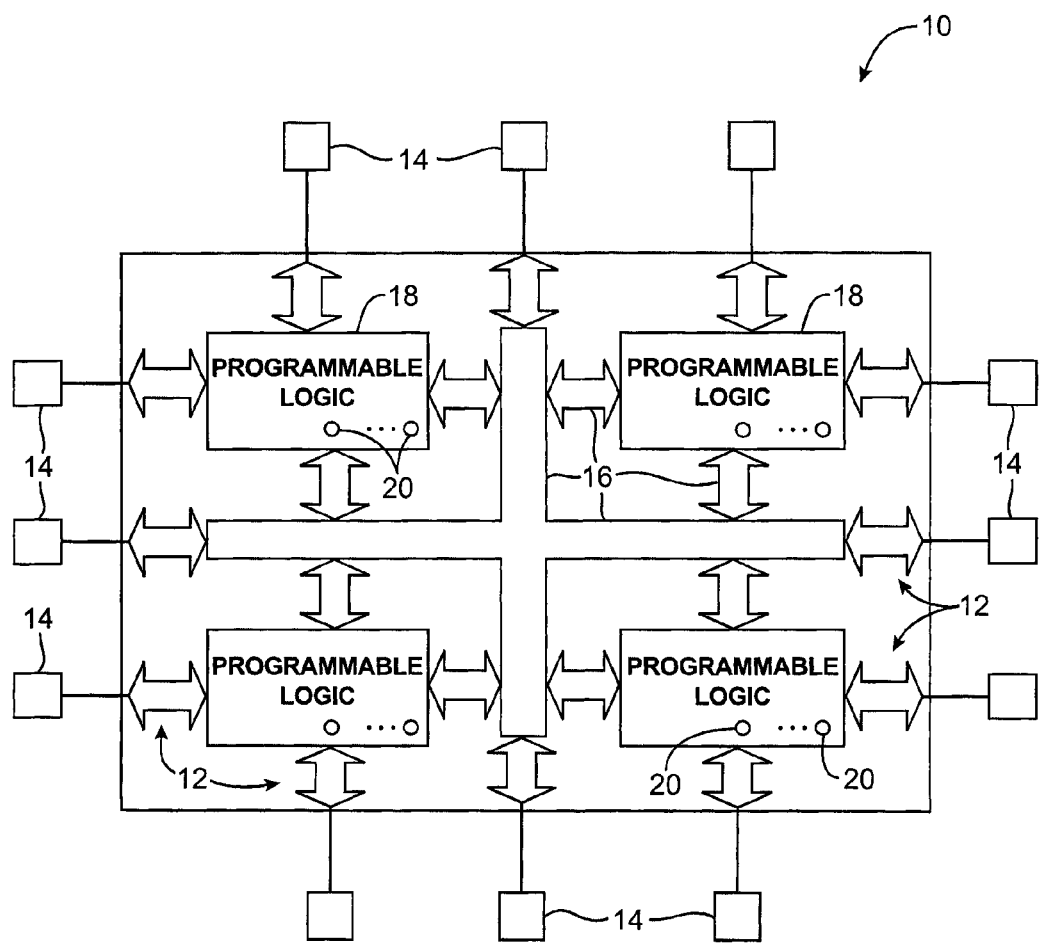
FIG. 5 is a diagram of an illustrative programmable logic device in accordance with an embodiment of the present invention.

An illustrative programmable logic device 10 that may be provided with decoupling capacitors such as capacitors based on capacitor components 40 is shown in FIG. 5. Programmable logic device 10 has input-output circuitry 12 for driving signals off of device 10 and for receiving signals from other devices via input-output pins 14. Interconnection resources 16 such as global and local vertical and horizontal conductive lines and buses are used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources 16 may be considered to be a part of programmable logic 10.

Programmable logic device 10 contains programmable elements 20 such as random-access memory cells and nonvolatile elements such as polysilicon fuses. Programmable elements 20 (e.g., volatile elements such as random-access memory cells) can be loaded with configuration data (also called programming data) using pins 14 and input-output circuitry 12. The programmable elements each provide a corresponding static control output signal that controls the state of an associated logic component in programmable logic 18. The programmable element output signals are typically used to control the gates of metal-oxide-semiconductor (MOS) transistors. Most of these transistors are generally n-channel metal-oxide-semiconductor (NMOS) pass transistors in programmable components such as multiplexers, look-up tables, logic arrays, AND, OR, NAND, and NOR logic gates, etc. When a programmable element output is high, the pass transistor controlled by that programmable element is turned on and passes logic signals from its input to its output. When the programmable element output is low, the pass transistor is turned off and does not pass logic signals.

The programmable elements may be loaded from any suitable source. In a typical arrangement, the programmable elements are loaded from an external erasable-programmable read-only memory and control chip called a configuration device via pins 14 and input-output circuitry 12. Nonvolatile elements may be electrically programmed during manufacturing using programming equipment or on-chip circuits (as examples).

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 6:
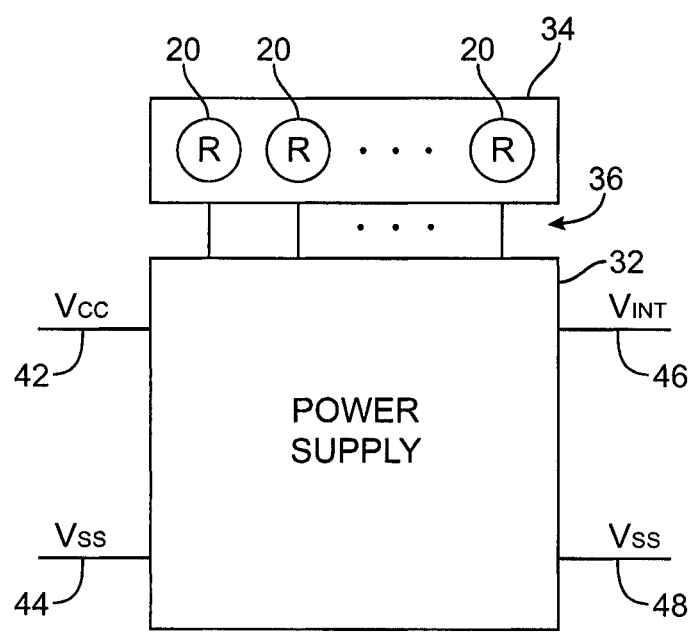
FIG. 6 is a circuit diagram showing a power supply and control circuitry with optional random-access-memory cells in accordance with an embodiment of the present invention.

The control circuitry 34 of FIG. 1 that controls power supplies 32 may contain programmable elements 20. FIG. 6 shows a diagram of an illustrative power supply and associated control circuitry containing optional programmable elements. Programmable elements 20 may be configuration random-access memory cells R that are implemented using volatile memory. If desired, programmable elements 20 may be implemented using nonvolatile elements such as polysilicon fuses. Control circuitry 34 is connected to power supply 32 with output terminals 36. Power supply 32 receives positive power supply voltage Vcc from power line 42 and ground power supply voltage Vss from power line 44. Power supply 32 outputs positive power supply voltage $V_{INT}$ on power line 46 and ground power supply voltage Vss on power line 48. Control circuitry 34 may control aspects of power supply functionality such as the magnitude of $V_{INT}$. Although control circuitry 34 is shown as containing programmable elements 20 in the example of FIG. 6, the use of programmable elements 20 in control circuitry 34 is merely illustrative. Control circuitry 34 may generate control signals without using programmable elements 20. Control signals derived directly from the states of programmable elements 20 may be static and may represent the loaded contents of those elements. Control circuitry 34 without programmable elements 20 may generate dynamic control signals for controlling power supply 32.

In some integrated circuits an adjustable power supply voltage $V_{INT}$ may be desirable. If the integrated circuit is a programmable logic device, for example, there may be a desire to raise and lower power supply voltages associated with memory cells during data loading and normal operation (an example).

Programmable memory elements 20 in programmable logic device 10 produce static output signals that reflect the configuration data that has been loaded into the memory elements. The static output signals drive the gates of metal-oxide-semiconductor (MOS) transistors. Some of the transistors are used as pass transistors in multiplexers and other logic components. The pass transistors in a programmable logic device will only operate properly if they are driven at a large enough voltage. If the pass transistors in a programmable logic device are driven at an insufficient voltage level because, for example, the $V_{INT}$ level of elements 20 or other associated circuitry on the device is too low, the data signals passing through the pass transistors will suffer excessive voltage loss and may no longer be recognizable as valid logic signals on the device. It may therefore be desirable if the programmable memory elements 20 were powered with a higher power supply voltage $V_{INT}$ during operation.

During data loading operations, programmable memory elements 20 may be loaded with configuration data using data lines and address lines. Address transistors that are controlled by address lines may be used to control which programmable memory elements are loaded. It may be desirable to have the programmable memory elements powered with a lower power supply voltage $V_{INT}$ during data loading operations to increase the write margin for the memory elements while relaxing requirements for the address transistors.

In some environments it may be desirable for programmable memory elements to be powered at different positive power supply voltages during operation of the programmable logic device. Memory elements that are powered with a larger power supply setting will be able to turn on associated pass transistors more fully than the memory elements that are powered with a lower power supply setting. This is because a higher voltage memory element output signal will turn on an n-channel metal-oxide-semiconductor pass transistor more fully than a lower voltage volt memory element output signal. The circuitry that is provided with the larger memory element power supply settings is therefore faster than the circuitry operated with the lower memory element power supply settings. The circuitry that is powered with the lower memory element power supply settings operates more slowly, but consumes less power.

By adjusting the memory element power supply settings on the integrated circuit, some circuit regions may be placed in fast mode, whereas other circuit regions may be placed in slow mode. The fast mode regions may be used to ensure that a user's desired timing constraints are met. For example, the regions of a programmable logic device that are used to handle critical circuit paths may be placed in fast mode, to ensure maximum performance. The slow mode regions may be used to reduce power consumption due to pass transistor leakage whenever maximum performance is not required.

As these examples demonstrate, integrated circuits such as integrated circuit 30 may often benefit from the use of adjustable power supplies. Particularly in environments such as these, it may be beneficial to provide satisfactory decoupling capacitors to reduce power supply noise that might arise from changes to $V_{INT}$.

Figure 7:
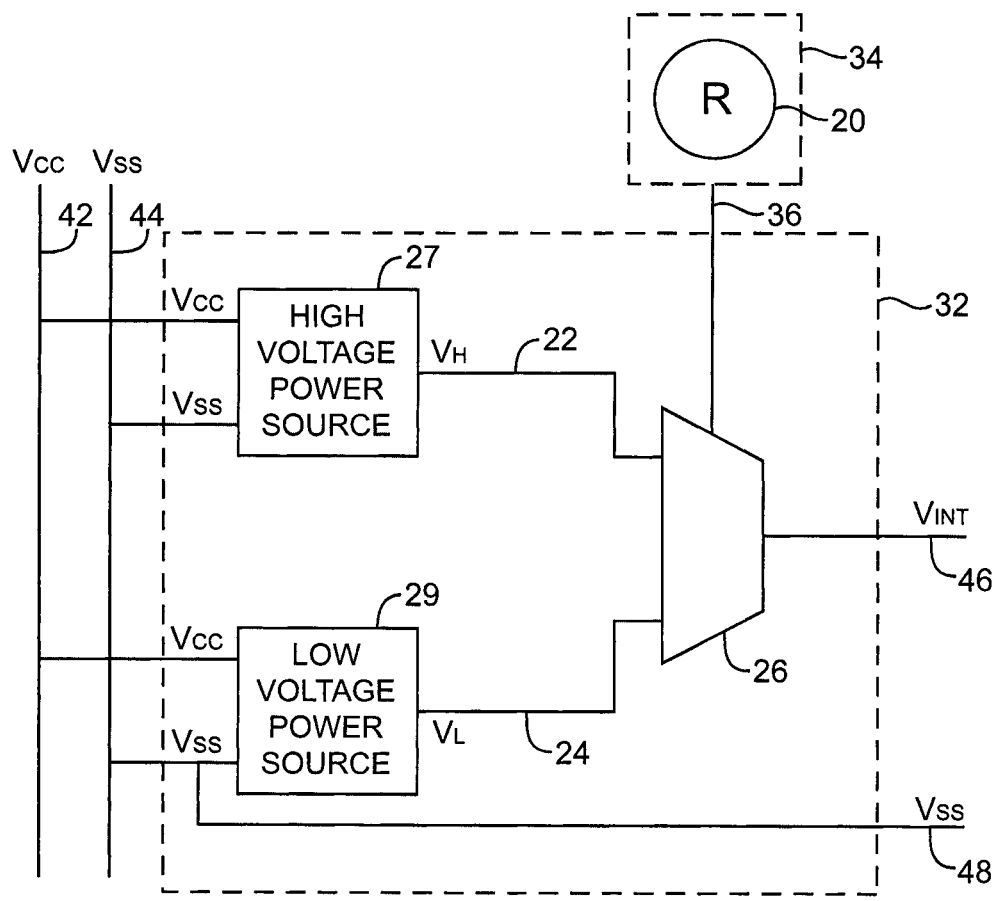
FIG. 7 is a circuit diagram showing a power supply and associated control circuitry in which the power supply can output either a relatively high power supply voltage or a relatively low power supply voltage in accordance with an embodiment of the present invention.

An illustrative circuit diagram for power supply 32 and control circuitry 34 is shown in FIG. 7. In the illustrative circuitry of FIG. 7 there are two possibilities for the level of adjustable supply voltage $V_{INT}$—a relatively higher voltage level $V_H$ and a relatively lower voltage level $V_L$. Power supply 32 may contain a high voltage power source 27 that receives positive power supply voltage Vcc on power line 42 and ground power supply voltage Vss on power line 44 and outputs a corresponding positive power supply voltage $V_H$ on power line 22. The power supply may also contain a low voltage power source 29 that receives positive power supply voltage Vcc on power line 42 and ground power supply voltage Vss on power line 44 and that provides a corresponding positive power supply voltage $V_L$ on power line 24. Voltage $V_L$ may be lower than voltage $V_H$. For example, $V_H$ may be 1.6 volts and $V_L$ may be 0.9 volts.

Multiplexer 26 may receive voltage $V_H$ on power line 22 and may receive voltage $V_L$ on power line 24. Multiplexer 26 may output either voltage $V_H$ or voltage $V_L$ as its output power supply voltage $V_{INT}$ on power line 46. The ground power supply voltage Vss may be output on power line 48. Control circuitry 34 may contain a single random-access memory cell 20 that supplies a single static control signal at its output. Control circuitry 34 may be connected to power supply 32 via output terminal 36. Control circuitry 34 can be used to select whether multiplexer 26 outputs $V_H$ or $V_L$ on its output power line 46. If the output on line 36 is high, for example, $V_{INT}$ may be set to $V_H$. If, however, the signal on line 36 is low, $V_{INT}$ may be set to $V_L$.

Any suitable voltage levels may be used for $V_H$ and $V_L$. For instance, the higher voltage $V_H$ might be equal to a Vcc value of 0.9 volts and a voltage divider might be used to reduce Vcc to the lower voltage $V_L$ (e.g. 0.8 volts). $V_L$ could be equal to Vcc (e.g. 0.9 volts) and a charge pump or external voltage source used to provide a $V_H$ value of 1.5 volts. Other values for $V_L$ and $V_H$ are also possible.

If desired, power supply 32 may contain more than two power sources and may provide more than two selectable levels of output voltages $V_{INT}$. To accommodate three or more output voltage levels, programmable elements 20 in control circuitry 34 may include more than one random-access memory cell and have more than one associated output terminal 36.

Decoupling capacitors may be connected across paths such as power supply rails 46 and 48 of FIG. 7 or any other circuitry in which it is desired to reduce noise Capacitors 60 for the capacitor cells 50 may be implemented as metal-insulator-metal (MIM) capacitors or metal-oxide-semiconductor (MOS) capacitors.

Figure 8:
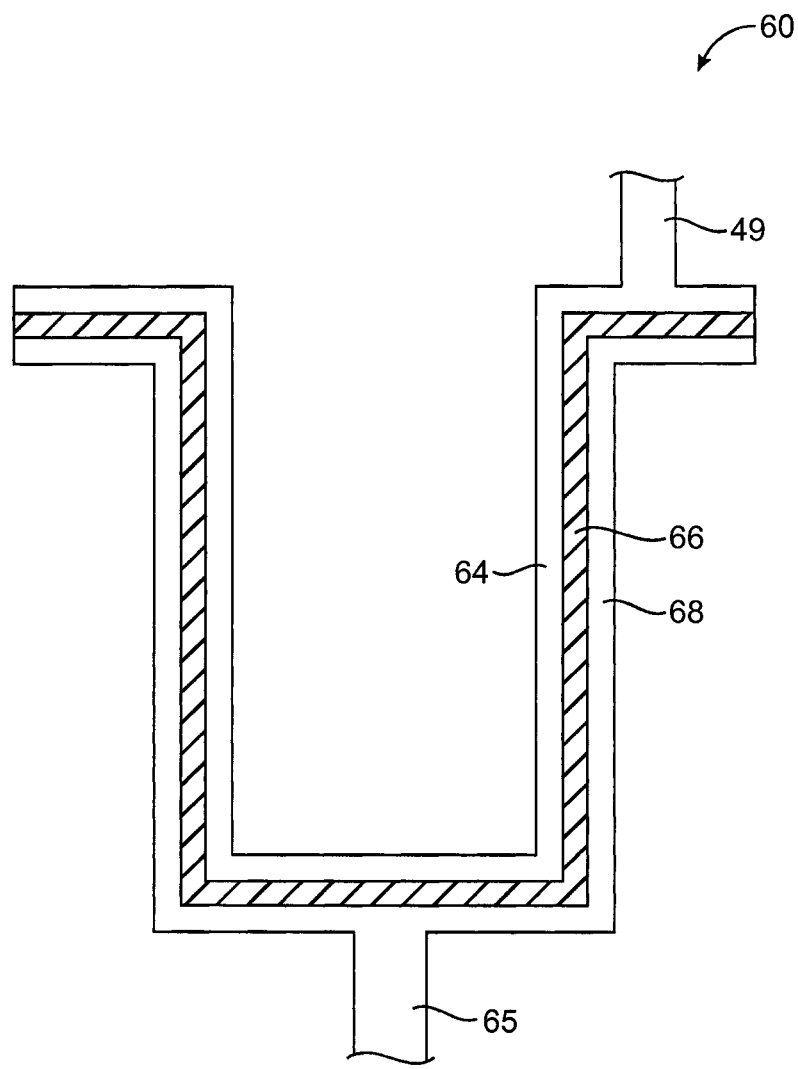
FIG. 8 is a diagram of a cross-section of a cylindrical metal-insulator-metal (MIM) capacitor in accordance with an embodiment of the present invention.

FIG. 8 shows the cross-section of an illustrative MIM capacitor structure that may be used in forming decoupling capacitors. The MIM capacitor of FIG. 8 has a first conductive portion such as metal layer 64, a second conductive portion such as metal layer 68, and a dielectric 66 interposed between the two conductive layers. The first and second conductive layers could be formed from metals such as copper, aluminum, gold, silver, palladium, tantalum, titanium, tungsten, other metals, metal alloys, or any suitable conductive material. An example of a conductive material that may be used for layers 64 and 68 that is not formed from a pure metal is polysilicon (e.g. silicided polysilicon). Dielectric 66 may be an oxide, a nitride, an oxynitride or any suitable dielectric material. Examples of suitable dielectric materials for layer 66 include silicon oxide, aluminum oxide, hafnium oxide, silicon carbide, silicon nitride, tantalum oxide, tantalum oxynitride, titanium oxide, and zirconium oxide. Terminal 49 may be connected to first metal layer 64 and terminal 65 may be connected to the second metal layer 68. Terminals 49 and 765 may be used to connect capacitor 60 to capacitor cell structures such as lines 49 and 51 and resistors 70 as described in connection with FIGS. 3A, 3B, and 3C.

Figure 9:
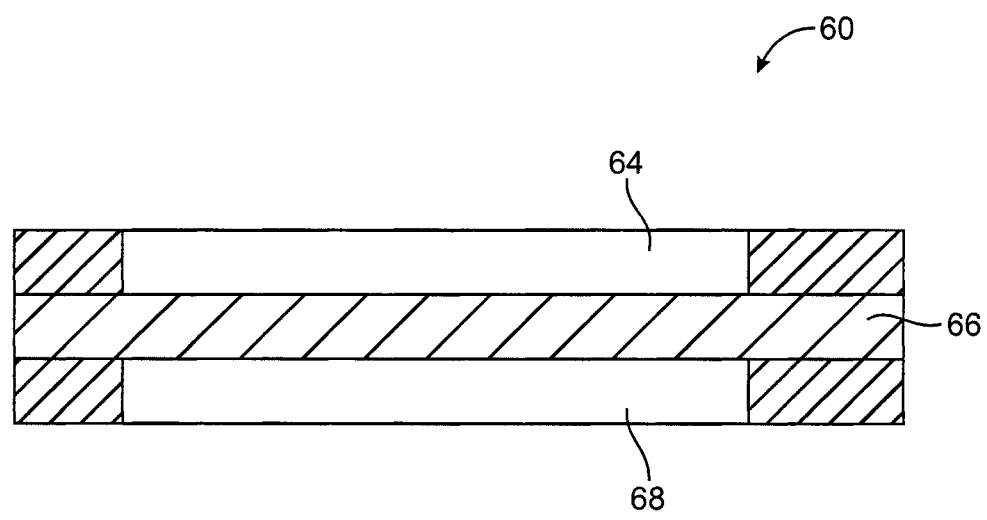
FIG. 9 is a diagram of a cross-section of a planar metal-insulator-metal (MIM) capacitor in accordance with an embodiment of the present invention.

Metal-insulator-metal (MIM) capacitor 60 of FIG. 8 can be formed using any suitable geometry. The illustration in FIG. 8 may represent the cross-section of a MIM capacitor with cylindrical or rectangular geometry. A MIM capacitor can take on aspect ratios different from the one shown. For example, a MIM capacitor may be much taller than it is wide or may be wider than it is tall. A tall MIM capacitor with a cross-section of the type shown in FIG. 8 has the advantage of having a small footprint, thus taking up minimal integrated circuit surface area ("real estate"). If desired, a MIM capacitor could also have a planar geometry, as shown by the cross-sectional view of FIG. 9. The illustration of FIG. 9 shows how a capacitor may be formed from a first metal layer 64, a second metal layer 68, and a planar dielectric 66 interposed between the two layers. Layers 64, 66, and 68 may be formed as successive layers in a dielectric stack on an integrated circuit. For example, capacitor electrodes 64 and 68 may be formed in respective metal layers and layers 66 may be formed in via layers. A MIM capacitor could have also configurations other than the ones shown in FIGS. 8 and 9. It could, for example, have a trench geometry. The examples of FIGS. 8 and 9 are merely illustrative.

Figure 10:
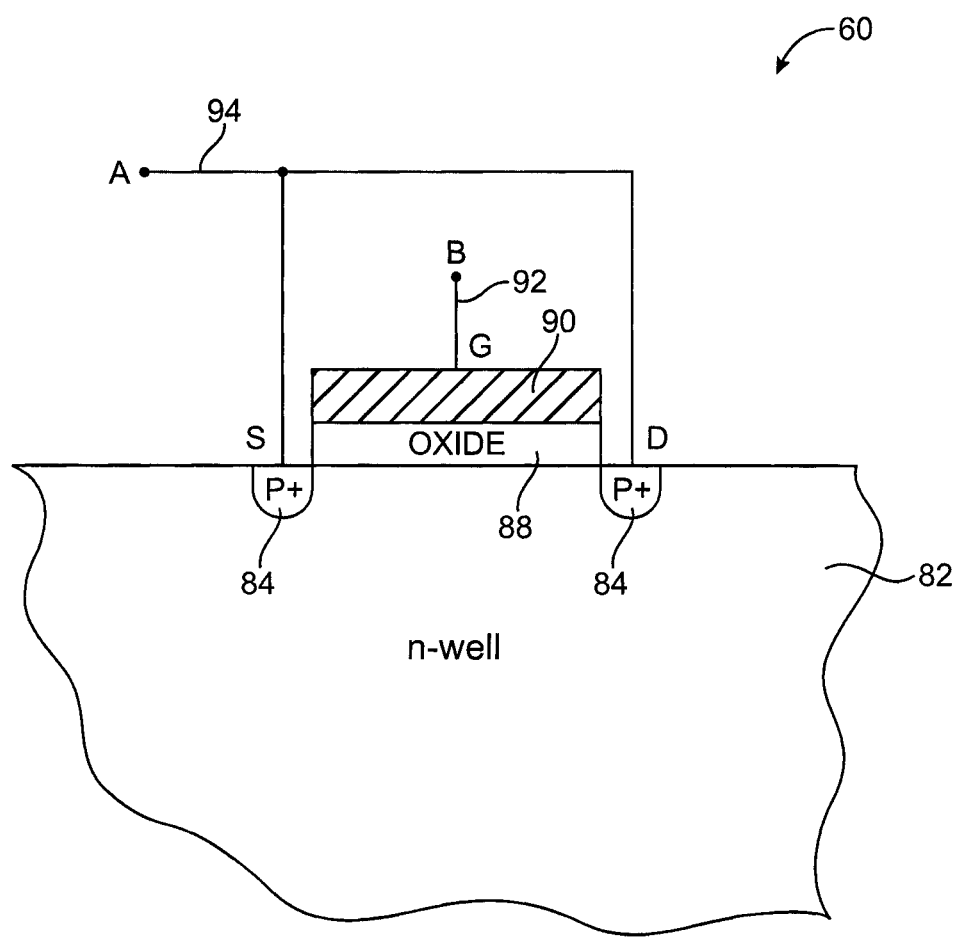
FIG. 10 is a diagram of a metal-oxide-semiconductor (MOS) capacitor located in an n-well in accordance with an embodiment of the present invention.

Metal-oxide-semiconductor (MOS) capacitor structures may also be used. As shown in FIG. 10, MOS capacitor 60 may have a gate insulator 88 and a gate conductor 90 associated with gate G. In a typical scenario, the gate insulator is formed from silicon oxide. If desired, the gate insulator may be formed from other insulating materials (e.g., so-called high-k dielectrics such as hafnium-based dielectrics, nitrides, oxynitrides, oxides other than silicon oxide, etc.). The gate conductor of a MOS capacitor may be formed from a metal or other suitable conductive material. With one suitable arrangement, the gate conductor is formed from a doped semiconductor such as doped polysilicon (e.g. silicided doped polysilicon). The use of doped polysilicon for the gate conductor may be advantageous because this type of gate conductor is process compatible and can be readily manufactured. Source-drain implant regions 84 are located in the semiconductor substrate 82 on either side of the gate insulator.

MOS capacitors include n-channel metal-oxide-semiconductor (NMOS) capacitors and p-channel metal-oxide-semiconductor (PMOS) capacitors. For NMOS capacitors the implant regions for source S and drain D (collectively "source-drain implant regions") are doped n-type and are formed in a p-well semiconductor substrate whereas for PMOS capacitors the source-drain implant regions are doped p-type and are formed in an n-well semiconductor substrate. The MOS capacitor shown in FIG. 10 is PMOS capacitor formed with p+ source-drain implant regions 84 in an n-well semiconductor substrate 82. Conductive paths 94 may be used to electrically connect source and drain regions 84 to capacitor terminal A. Conductive path 92 may be used to short the gate contact to capacitor terminal B. Paths such as paths 92 and 94 may be formed from metal, doped polysilicon, or other suitable conductors. During operation of capacitor 60, voltage may be applied to the capacitor across terminals A and B. MOS capacitors for a decoupling capacitor may be located on the semiconductor substrate along with powered devices 38.

If desired, decoupling capacitors may be formed from a mixture of MOS capacitor structures and MIM structures. An advantage of using only MIM structures such as MIM structure 60 of FIG. 9 or, more particularly, MIM structure 60 of FIG. 8, is that these arrangements have minimal impact on the amount of surface area available for forming active circuitry on circuit 30. Accordingly, illustrative decoupling capacitor arrangements in which capacitors 60 in cells 50 are formed using cylindrical MIM structures such as structures 60 of FIG. 8 and planar MIM structures such as structures 60 of FIG. 9 are sometimes described as an example.

Figure 11:
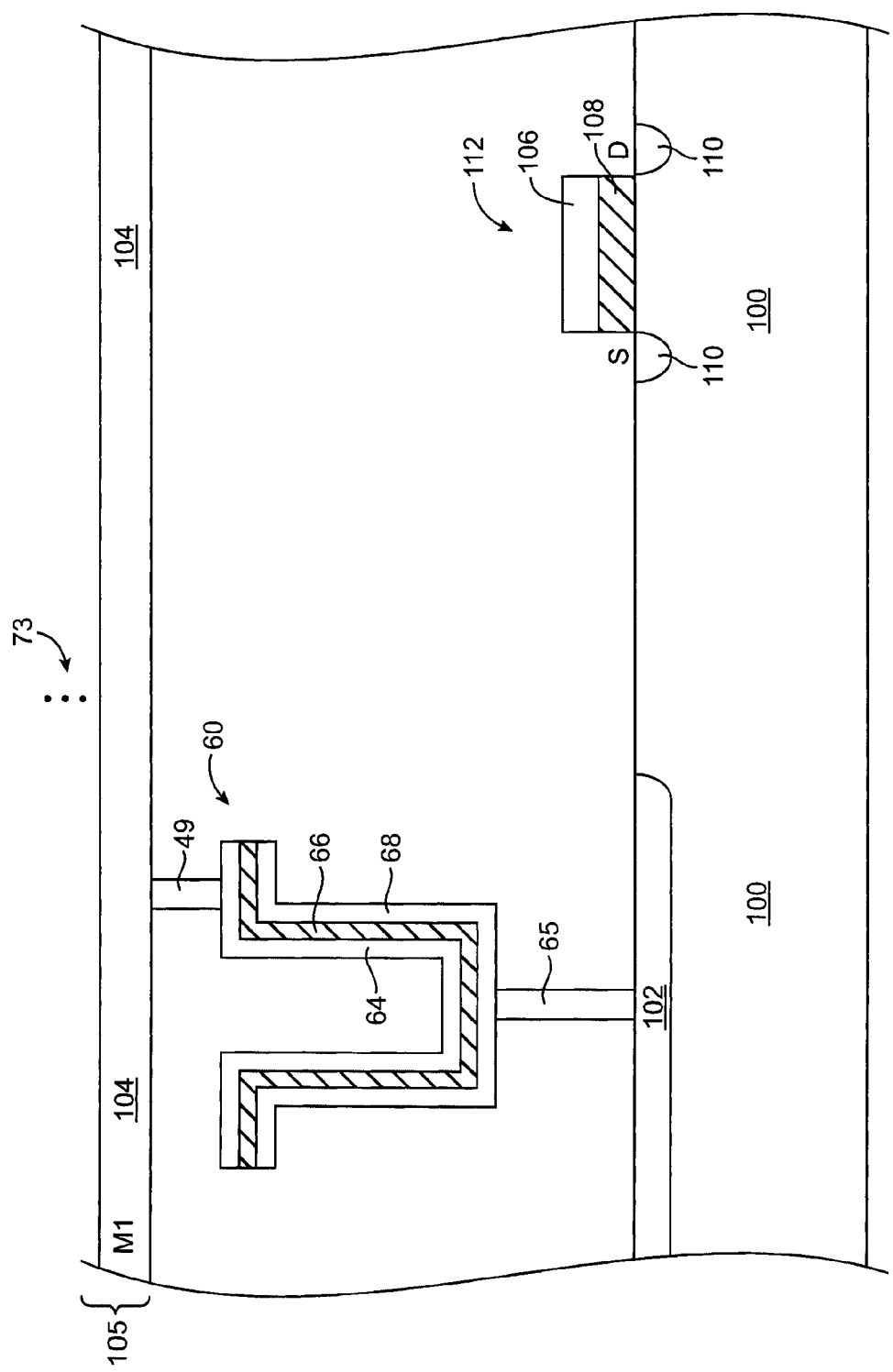
FIG. 11 is a diagram showing a cylindrical metal-insulator-metal capacitor and a powered circuit component both located on a semiconductor substrate in accordance with an embodiment of the present invention.

FIG. 11 shows an illustrative cylindrical MIM capacitor 60 positioned above semiconductor substrate 100. Semiconductor substrate 100 may be formed from silicon or any other semiconductor materials. Source-drain implant region 102 in semiconductor substrate 100 may be n-type or p-type. Dopant ions for implant regions such as region 102 may be boron, phosphorus, arsenic, or other suitable dopant ions. A layer of silicide may be formed on the source-drain implant region to reduce its resistance. In capacitor 60 of FIG. 11, terminal 65 is connected to source-drain implant region 102. Capacitor 60 is shown as having a cylindrical MIM capacitor structure with a first metal layer 64, a second metal layer 68, and a dielectric 66 interposed between layers 64 and 68, but other types of capacitors or MIM capacitors with other geometries may also be used if desired.

Interconnects for integrated circuit 30 may be formed in a dielectric stack on the surface of circuit 30 (shown schematically as stack 105 in FIG. 11). Dielectric stack 105 may include alternating dielectric layers (i.e. metal interconnect layers and via interconnect layers). During semiconductor fabrication, the resources in the dielectric stack are patterned to form interconnects. The interconnects connect the circuitry on integrated circuit 30 so that it performs its desired functions. FIG. 11 shows first metal interconnect layer 104 which is the metal interconnect layer closest to semiconductor substrate 100 (sometimes referred to as "M1"). Above first metal interconnect layer 104 there may be additional metal interconnect layers and via interconnect layers as illustrated by dots 73. Terminal structure 49 may be used to connect capacitor 60 to first metal interconnect layer 104.

Also shown in FIG. 11 is a metal-oxide-semiconductor (MOS) transistor 112. Metal-oxide-semiconductor transistor 112 has a gate insulator 108 and a gate conductor 106. In a typical scenario, the gate insulator is formed from silicon oxide. If desired, the gate insulator may be formed from other insulating materials (e.g., so-called high-k dielectrics such as hafnium-based dielectrics, nitrides, oxynitrides, oxides other than silicon oxide, etc.). The gate conductor of a metal-oxide-semiconductor transistor may be formed from a metal or other suitable conductive material such as doped polysilicon. On either side of oxide layer 108 are source-drain implant regions 110 that serve as source S and drain D for transistor 112. MOS transistors include n-channel metal-oxide-semiconductor (NMOS) transistors and p-channel metal-oxide-semiconductor (PMOS) transistors. Source-drain implant regions for NMOS transistors are doped n-type whereas source-drain implant regions for PMOS transistors are doped p-type.

As shown in FIG. 11, MOS transistor 112, which may form part of powered circuit components 38, may be located in the vicinity of decoupling capacitor structures such as capacitor 60. Powered circuit components on the integrated circuit may include devices other than MOS transistors 112. It is desirable to distribute capacitors 60 and clusters 40 close to powered circuit components to reduce the effect of interposed inductances and resistances. Distributing the decoupling capacitor components in this way maximizes the noise-reducing properties of the decoupling capacitance.

When capacitors 60 are formed using structures of the type shown in FIG. 11, capacitors 60 and powered circuit components 38 can both be formed in the lowest layers above substrate 100. For example, the source-drain implant region 102 for capacitor 60 may be formed in the same step as source-drain implant region 110 for powered circuit components such as transistor 112. Forming capacitors and powered circuit components in the same processing steps allows efficient fabrication.

Capacitors may also be located in other layers of the integrated circuit if desired. For example, MIM capacitors such as the planar MIM capacitor in FIG. 10 may be located in higher layers of the dielectric stack 105 (FIG. 11). These MIM capacitors can be formed from structures in multiple interconnect layers including those that utilize both vertical and lateral electric field components. MIM capacitor structures may be formed directly above powered devices, which allows capacitors of this type to consume minimal circuit real estate.

Figure 12:
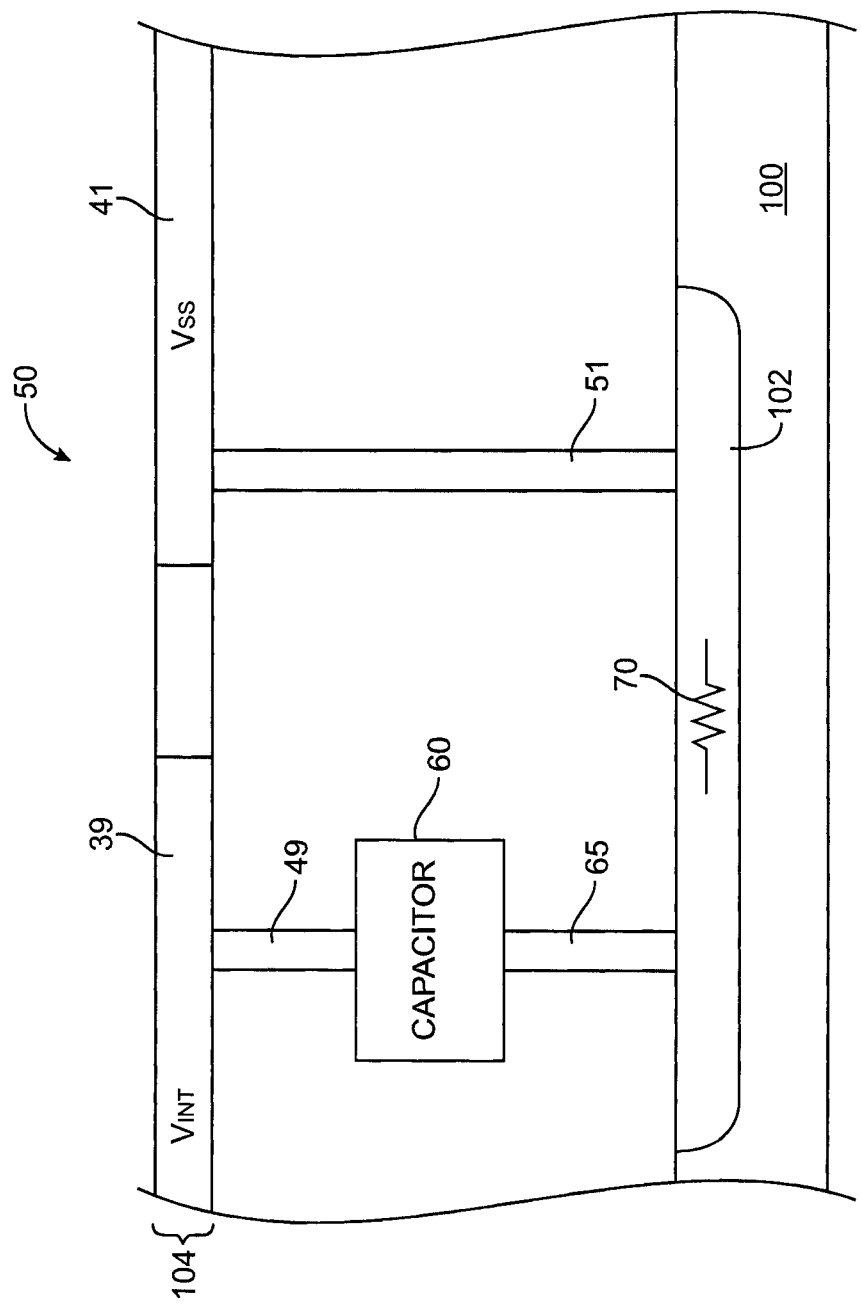
FIG. 12 is a diagram showing a capacitor cell with a series resistor formed from a resistive path through an adjacent source-drain implant region in a semiconductor substrate in accordance with an embodiment of the present invention.

In arrangements of the type shown in FIG. 11, when capacitor 60 is located in a lower layer of circuit 30, in the vicinity of semiconductor substrate 100, resistor 70 of cell 50 can be readily implemented as a resistive path through the source-drain implant region of the semiconductor substrate. FIG. 12 shows an illustrative arrangement of this type that may be used for capacitor cell 50. Capacitor 60 of FIG. 12 has one terminal connected to source-drain implant region 102 on semiconductor substrate 100. Source-drain implant region 102 in semiconductor substrate 100 may be an n-type or p-type implant region. A layer of silicide may be formed on the source-drain region to reduce its resistance.

In FIG. 12, $V_{INT}$ conductive path 39 and Vss conductive path 41 are shown as being formed in first metal interconnect layer 104. If desired, paths 38 and 41 may be located in other suitable metal interconnect layers. Terminal 49 may connect capacitor 60 to $V_{INT}$ conductive path 39. Path 65 may connect capacitor 60 to source-drain implant region 102. Conductive path 51 may connect source-drain implant region 102 with Vss conductive path 41. Paths such as 49, 65, and 51 may be formed from polysilicon, metal, or any other suitable structures (e.g. structures in a contact layer, metal layer, etc.). In the event of a short due to a fault, current will flow down through capacitor 60 from path 39, into source-drain implant region 102, and across source-drain implant region 102, which forms a resistive path 70 for the current. Shorting current may then continue though conductive path 51 to Vss conductive path 41. Using source-drain implant region 102 as a resistive path in this way minimizes the need for additional processing steps to create resistors 70 during integrated circuit fabrication.

Figure 13:
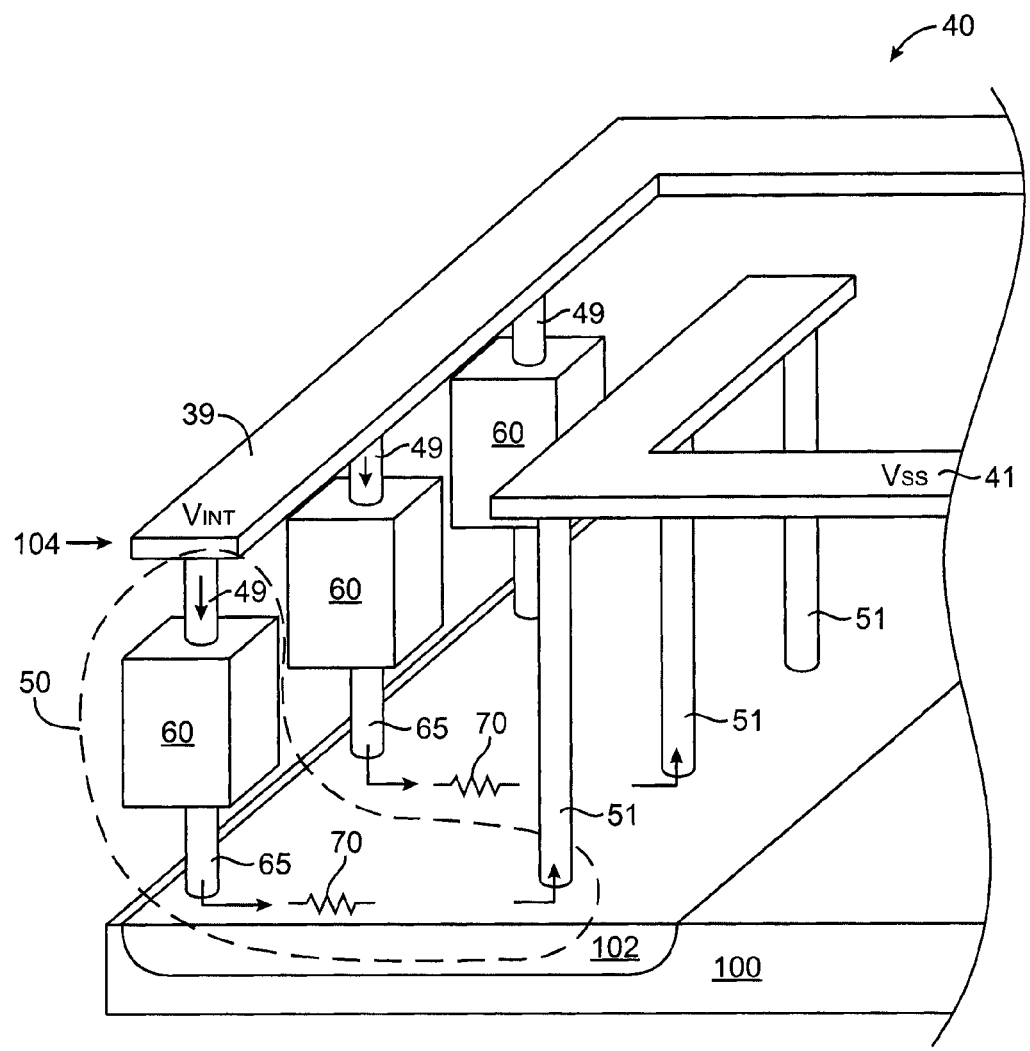
FIG. 13 is a perspective view of a cluster of capacitor cells with resistive paths through a source-drain implant region in a semiconductor substrate in accordance with an embodiment of the present invention.

FIG. 13 is a perspective view of a portion of capacitor cluster 40 having capacitor cells 50 that use source-drain implant region 102 to form resistors 70. FIG. 13 shows how capacitors 60 may be located above source-drain implant region 102 in semiconductor substrate 100. For ease of fabrication, capacitors 60 that are in the same cluster may be the same type of capacitor (e.g. cylindrical MIM capacitors), although this is not required.

As shown in FIG. 13, $V_{INT}$ conductive path 39 and Vss conductive path 41 may be formed in first metal interconnect layer 104. Capacitor cells 50 may be connected in parallel between $V_{INT}$ and Vss to form clusters 40. Terminals 49 may connect capacitors 60 to $V_{INT}$ conductive path 39. Conductive paths 51 may connect source-drain implant region 102 with Vss conductive path 41. Paths 65 may be used to connect each capacitor 60 to a resistor 70 (i.e. a respective portion of implant region 102). As shown, resistors 70 need not be electrically isolated from one another. Rather, resistors 70 may be implemented using a shared implant region 102. If desired, region 102 may be segmented.

In FIG. 13, cluster 40 is shown as having three capacitor cells 50. In an actual decoupling capacitor cluster, it might be desirable to have numerous capacitors per cluster (e.g. hundreds or more, thousands or more, tens of thousands or more, hundreds of thousands or more). In FIG. 13, capacitor cells 50 are shown positioned in a row, but any suitable configuration can be used.

Figure 14:
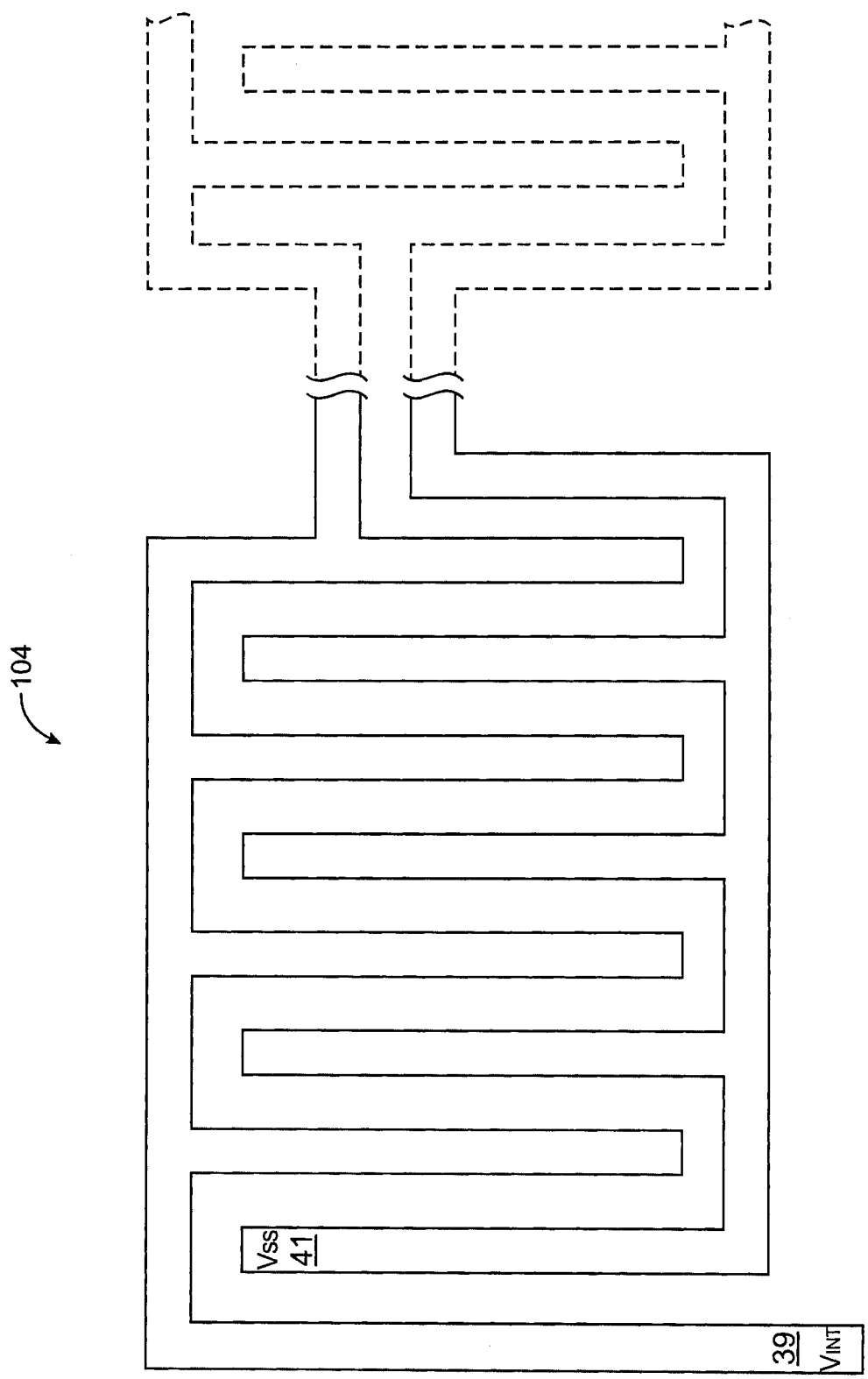
FIG. 14 is a top view of a portion of an integrated circuit showing comb-like conductive paths that may be used in distributing a positive power supply voltage and a ground power supply voltage in accordance with an embodiment of the present invention.

The $V_{INT}$ conductive paths 39 and Vss conductive paths 41 may be formed from two distinct metal interconnect layers or may be formed from the same metal interconnect layer. In arrangements in which the conductive paths are formed from a common metal layer, the conductive paths may form comb-like structures with interdigitated fingers as shown in FIG. 14. Each comb-like structure may form a separate capacitor cluster terminal (e.g. terminals 39 and 41). The $V_{INT}$ conductive paths 39 and the Vss conductive path 41 are shown as being implemented in the first metal layer 104 in FIGS. 13 and 14. A first set of fingers (the solid lines on the left hand side of FIG. 14) may be associated with a first capacitor cluster and a second set of fingers (the dashed lines on the right hand side of FIG. 14) may be associated with a second capacitor cluster, and so on for all of the capacitor clusters on the integrated circuit.

The values for capacitance C of capacitor 60 and resistance R of resistor 70 may be selected to avoid damage to device 30 in the event of a dielectric fault. In the case of a fault that shorts a capacitor 60, resistor 70 limits the current $I_{SHORT}$ through the faulty capacitor cell 50 to $(V_{INT}-Vss)/R$. The value of resistance R is preferably large enough so that the current $I_{SHORT}$ though the faulty capacitor cell 50 and power lines 46 and 48 are within acceptable limits. However, putting the resistor in series with the capacitor forms an (resistor-capacitor) RC circuit with an associated time constant given by R times C. This time constant is preferably less than the time constant characteristics of undesirable noise on power lines 46 and 48. This ensures that the capacitor cell 40 will function properly as a decoupling capacitor.

The decoupling capacitor arrangements described herein allow for values of resistance R and capacitance C that would be appropriate for a typical integrated circuit. If, as an example, a typical value for $V_{INT}$ is 1 volt and a typical value for Vss is 0 volt, a resistance R of 10 ohms would result in a current $I_{SHORT}$ through a shorted capacitor 60 of 0.1 amps. If, in the absence of a shorted capacitor, the current flowing though power lines 46 and 48 is 1 amp, then, in the event of the short, the current though power lines 46 and 48 would increase to 1.1 amp. This 10% in current may represent an acceptable value for a typical integrated circuit. In the event of more than one shorted capacitor, the current through power lines 46 and 48 would increase by 0.1 amps per shorted capacitor. If many faults are expected, R may be increased. As this example demonstrates, a resistance R of 10 ohm or more for each resistor 70 in each capacitor cell 50 may protect the integrated circuit from one or more faults in capacitors 60.

The resistance though a typical silicided source-drain implant region may be about 10 ohm/square. Implementing resistance R as a resistive path though a source-drain implant region of this type may use a region that is approximately as long as it is wide for each resistor 70.

Undesirable noise through a typical integrated circuit might have a time constant of 50 picoseconds. Capacitor cells 50 would thus preferably have a time constant of less than 10 picoseconds in order to be effective as decoupling capacitors. If capacitance C of capacitor 60 is chosen as 10 femtofarads and resistance R is 10 ohm, then the time constant for capacitor cell 50 will be 0.1 picoseconds. This is much less than the required upper bound. A capacitance of 10 femtofarads can be implemented using MIM structures of the types described in connection with FIGS. 8 and 9 or using a MOS capacitor structure of the type described in connection with FIG. 10.

A typical integrated circuit might require a total decoupling capacitance of 500 nanofarads. With a capacitance C of 10 femtofarads per capacitor, a total of 50,000,000 capacitor cells would be required per integrated circuit. These capacitor cells can be distributed in 500 clusters with 1 nanofarad (100,000 capacitor cells) in each cluster. On an integrated circuit with an area of 1 square centimeter, the clusters would be placed with a density of 1 cluster per 20 microns squared.

The specific values used for this example are for illustrative purposes only. Actual voltages and currents would be different for different integrated circuits, and the optimal implementation of decoupling capacitors will depend on the specific characteristics of the integrated circuit under consideration.

The foregoing is merely illustrative of the principles of this invention and various modifications can be made by those skilled in the art without departing from the scope and spirit of the invention.

What is claimed is:

1. An integrated circuit comprising:
   a power supply voltage path on which an adjustable power supply voltage is provided;
   a ground power supply path;
   a plurality of power supply decoupling capacitors distributed in a plurality of parallel clusters on the integrated circuit, wherein the plurality of parallel clusters of capacitor cells are coupled between the power supply voltage path and the ground power supply path;
   a first power source that is coupled to a power supply voltage path and the ground power supply path and that outputs a first voltage;
   a second power source that is coupled to the power supply voltage path and the ground power supply path and that outputs a second voltage that is lower than the first voltage;
   a first region of memory cells;
   a first multiplexer that receives the first and second voltages and that selectively outputs the first voltage to the first region of memory cells in response to determining that the first region of memory cells is to be placed in a fast mode;
   a second region of memory cells; and
   a second multiplexer that receives the first and second voltages and that selectively outputs the second voltage to the second region of memory cells in response to determining that the second region of memory cells is to be placed in a slow mode.

2. The integrated circuit defined in claim 1 wherein the capacitors comprise metal-insulator-metal capacitors.

3. The integrated circuit defined in claim 2 wherein the metal-insulator-metal capacitors have a cylindrical geometry.

4. The integrated circuit defined in claim 2 wherein the metal-insulator-metal capacitors have a planar geometry.

5. The integrated circuit defined in claim 4 wherein the metal-insulator-metal capacitors are located in metal interconnect layers of the integrated circuit.

6. An integrated circuit comprising:
   a plurality of distributed clusters of power supply decoupling capacitor cells, wherein the capacitor cells in each cluster are connected in parallel, and wherein each capacitor cell comprises:
   a capacitor; and
   a resistor connected in series with the capacitor, wherein the capacitor cells in each capacitor cell cluster are connected between first and second respective sets of interdigitated fingers formed in a common metal layer on the integrated circuit and wherein the capacitor in each cell comprises a cylindrical metal-insulator-metal capacitor.

7. The integrated circuit defined in claim 6 wherein each cylindrical metal-insulator-metal capacitor is located between a semiconductor substrate and a metal layer of the integrated circuit.

8. The integrated circuit defined in claim 6, wherein the integrated circuit has a semiconductor substrate and wherein the resistor in each capacitor cell is formed from a resistive path through a source-drain implant region in the semiconductor substrate.

9. An integrated circuit comprising:
   at least one power supply that supplies power across first and second power supply lines;
   a plurality of distributed power supply capacitor cell clusters, each capacitor cell cluster coupled across the first and second power supply lines, wherein each capacitor cell cluster comprises a plurality of capacitor cells coupled in parallel, and wherein each capacitor cell comprises:
   a capacitor; and
   a resistor coupled in series with the capacitor, wherein the resistor is formed from a source-drain implant region in a semiconductor substrate of the integrated circuit, wherein the capacitor cells in each capacitor cell cluster are coupled between first and second respective sets of interdigitated fingers formed in a common metal layer on the integrated circuit.

10. The integrated circuit as defined in claim 9 wherein the capacitor in each capacitor cell comprises a metal-insulator-metal capacitor.

11. The integrated circuit as defined in claim 10 wherein the metal-insulator-metal capacitor in each cell has a cylindrical geometry.

12. The integrated circuit defined in claim 9 wherein the power supply comprises a multiplexer connected to the first power supply line that supplies either a first or second positive power supply voltage to the first power supply line.

13. An integrated circuit comprising:
   at least one power supply that supplies power across first and second power supply lines;
   a plurality of distributed power supply capacitor cell clusters, each capacitor cell cluster coupled across the first and second power supply lines, wherein each capacitor cell cluster comprises a plurality of capacitor cells coupled in parallel, and wherein each capacitor cell comprises:
   a capacitor; and
   a resistor coupled in series with the capacitor, wherein the resistor is formed from a source-drain implant region in a semiconductor substrate of the integrated circuit, wherein the capacitor in each capacitor cell comprises a metal-insulator-metal capacitor, and wherein the integrated circuit is a programmable logic device containing programmable memory elements that are operable to produce static control signals and wherein the power supply is adjustable to produce at least two different positive power supply voltages across the first and second power supply lines in response to the static control signals.

* * * * *